(12) United States Patent
Kawai

(10) Patent No.: US 10,104,820 B2
(45) Date of Patent: Oct. 16, 2018

(54) MOUNTING MACHINE

(71) Applicant: FUJI CORPORATION, Chiryu (JP)

(72) Inventor: Hidetoshi Kawai, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 356 days.

(21) Appl. No.: 14/916,393

(22) PCT Filed: Sep. 24, 2013

(86) PCT No.: PCT/JP2013/075710
§ 371 (c)(1),
(2) Date: Mar. 3, 2016

(87) PCT Pub. No.: WO2015/045002
PCT Pub. Date: Apr. 2, 2015

(65) Prior Publication Data
US 2016/0198596 A1     Jul. 7, 2016

(51) Int. Cl.
*H05K 13/04*     (2006.01)
*H05K 13/00*     (2006.01)
*H05K 13/08*     (2006.01)

(52) U.S. Cl.
CPC ..... *H05K 13/0404* (2013.01); *H05K 13/0061* (2013.01); *H05K 13/0069* (2013.01);
(Continued)

(58) Field of Classification Search
CPC .. H05K 1/0266; H05K 1/0268; H05K 1/0269; H05K 13/0061; H05K 13/0069;
(Continued)

(56) References Cited

U.S. PATENT DOCUMENTS

| 5,937,513 A | 8/1999 | Inutsuka et al. |
| 2002/0014732 A1 | 2/2002 | Isogai et al. |

(Continued)

FOREIGN PATENT DOCUMENTS

| CN | 102642714 A | 8/2012 |
| EP | 1 178 717 A2 | 2/2002 |

(Continued)

OTHER PUBLICATIONS

International Search Report dated Dec. 3, 2013, in PCT/JP2013/075710 Filed Sep. 24, 2013.

(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57) ABSTRACT

A mounting machine acquires identification information arranged in a back-up plate, from the back-up plate. The mounting machine controls a conveyance unit so as to change a conveyance lane based on mounting conditions when the acquired identification information is identification information which is included in the mounting conditions of a printed circuit board. Meanwhile, in the mounting machine, when the acquired identification information is not the identification information which is included in the mounting conditions of the printed circuit board, the conveyance lane is stopped from being changed. In this manner, a conveyance width of the conveyance lane is not changed when the back-up plate which is ready to be subjected to mounting processing and matches the mounting conditions is not mounted.

6 Claims, 5 Drawing Sheets

(52) U.S. Cl.
CPC ... *H05K 13/08* (2013.01); *H05K 2201/09927* (2013.01); *H05K 2203/0165* (2013.01); *H05K 2203/163* (2013.01); *Y10T 29/4913* (2015.01); *Y10T 29/53174* (2015.01)

(58) Field of Classification Search
CPC .......... H05K 13/0404; H05K 13/0408; H05K 13/08; H05K 2201/09927; H05K 2201/09936; H05K 2203/0165; H05K 2203/15; H05K 2203/1509; H05K 2203/1545; H05K 2203/16; H05K 2203/163; Y10T 29/4913; Y10T 29/49131; Y10T 29/43004; Y10T 29/43039; Y10T 29/43174; Y10T 29/43178; Y10T 29/43187; Y10T 29/43191; Y10T 29/53265
See application file for complete search history.

(56) References Cited

U.S. PATENT DOCUMENTS

2004/0055149 A1    3/2004  Isogai et al.
2009/0126187 A1*   5/2009  Kajiyama .............. B23Q 1/035
                                                      29/760
2011/0268346 A1*  11/2011  Ito ...................... H05K 13/0069
                                                      382/151

FOREIGN PATENT DOCUMENTS

| | | |
|---|---|---|
| JP | 5-246519 A | 9/1993 |
| JP | 9-172298 A | 6/1997 |
| JP | 2012-235093 A | 11/2012 |
| WO | 2005/051066 A1 | 6/2005 |

OTHER PUBLICATIONS

Extended European Search Report dated Sep. 6, 2016 in Patent application No. 13894140.6.
Combined Chinese Office Action and Search Report dated Apr. 4, 2018 in Chinese Patent Application No. 201380079761.4 (with English translation and English translation of Category of Cited Documents), citing document AO therein, 10 pages.

* cited by examiner

MOUNTING MACHINE

TECHNICAL FIELD

The present disclosure relates to a mounting machine.

BACKGROUND ART

In the related art, a mounting machine in which a memory medium storing ID information is added to a top surface of a board support unit supporting a printed circuit board and an alarm is displayed by acquiring the ID information when an operator erroneously mounts the board support unit has been proposed (for example, refer to PTL 1).

CITATION LIST

Patent Literature

PTL 1: International Publication No. 2005-051066

SUMMARY

Technical Problem

Incidentally, there is a mounting machine which automatically changes a conveyance width of a board conveyance unit in accordance with a width of a printed circuit board. In the device disclosed in PTL 1 described above, even though replacement of a board support unit can be precisely and reliably performed, the automatically changed conveyance width thereof is not particularly taken into consideration. Therefore, while still being insufficient in the device disclosed in PTL 1 described above, there is a demand for more reliable replacement processing of the board support unit performed in accordance with the change of the conveyance width of the board conveyance unit.

The present disclosure has been made in consideration of the aforementioned problem, and a main object thereof is to provide a mounting machine in which the conveyance width of the conveyance unit can be more reliably changed when replacement processing of the board support member is performed.

Solution to Problem

The present disclosure has adopted the following device in order to achieve the above-described main object.

In other words, a mounting machine according to the present disclosure executes mounting processing of mounting a component on a printed circuit board. The mounting machine includes a mounting unit that has a mounting head holding the component and moving the component onto the printed circuit board, a conveyance unit that has a changing mechanism changing a conveyance lane to a plurality of conveyance widths in accordance with a width of the printed circuit board and conveying the printed circuit board, an information acquisition device for acquiring identification information arranged in a detachable board support member which is arranged on an inner side of the conveyance lane and supports the printed circuit board from below, from the board support member, and a control device for controlling the conveyance unit so as to change the conveyance lane based on mounting conditions when the acquired identification information is identification information which is included in the mounting conditions of the printed circuit board and stopping the conveyance lane from being changed when the acquired identification information is not the identification information which is included in the mounting conditions of the printed circuit board.

The mounting machine acquires the identification information arranged in the detachable board support member which is arranged on the inner side of the conveyance lane and supports the printed circuit board from below, from the board support member. The mounting machine controls the conveyance unit so as to change the conveyance lane based on the mounting conditions when the acquired identification information is the identification information which is included in the mounting conditions of the printed circuit board. Meanwhile, the mounting machine stops the conveyance lane from being changed when the acquired identification information is not the identification information which is included in the mounting conditions of the printed circuit board. In other words, there is no change of the conveyance lane. In this manner, since the conveyance width of the conveyance lane is not changed when the board support member which is ready to be subjected to the mounting processing and matches the mounting conditions is not mounted, the board support member and the conveyance unit can be prevented from interfering with each other. Therefore, in the mounting machine of the present disclosure, the conveyance width of the conveyance unit can be more reliably changed when replacement processing of the board support member is performed.

In the mounting machine of the present disclosure, the control device may execute changing processing related to the mounting processing based on the mounting conditions while the conveyance lane is stopped from being changed. Accordingly, the conveyance width of the conveyance unit can be more reliably changed, and the changing processing accompanying replacement of the board support member can be more efficiently performed. In this case, the changing processing may be processing of one or more among replacement of the mounting head, replacement of a nozzle holding body which is mounted in the mounting head, replacement of a suction nozzle which is mounted in the mounting head, and replacement of a supply unit which supplies the component.

In the mounting machine of the present disclosure, the control device may cause the mounting unit to execute the mounting processing after changing the conveyance lane and may output information of the printed circuit board subjected to the mounting processing and the acquired identification information of the board support member to a memory device. Accordingly, information of the board support member used in the mounting processing can be stored. Therefore, information of a correspondence relationship between the printed circuit board and the board support member can be utilized thereafter.

In the mounting machine of the present disclosure, the identification information which is recognizable by being imaged may be arranged in the board support member. The information acquisition device may image and acquire the identification information of the board support member. Accordingly, the identification information can be acquired through imaging processing. In addition, in a mounting machine including an imaging unit which images the printed circuit board, the imaging unit can also be used to image the printed circuit board and the identification information. Therefore, it is possible to simplify the configuration and to more reliably change the conveyance width of the conveyance unit. The identification information may be a bar code or a 2D code.

In the mounting machine of the present disclosure, the board support member may be a vacuum-type board support unit which fixes one or more printed circuit boards.

DESCRIPTION OF EMBODIMENTS

Figure 1:
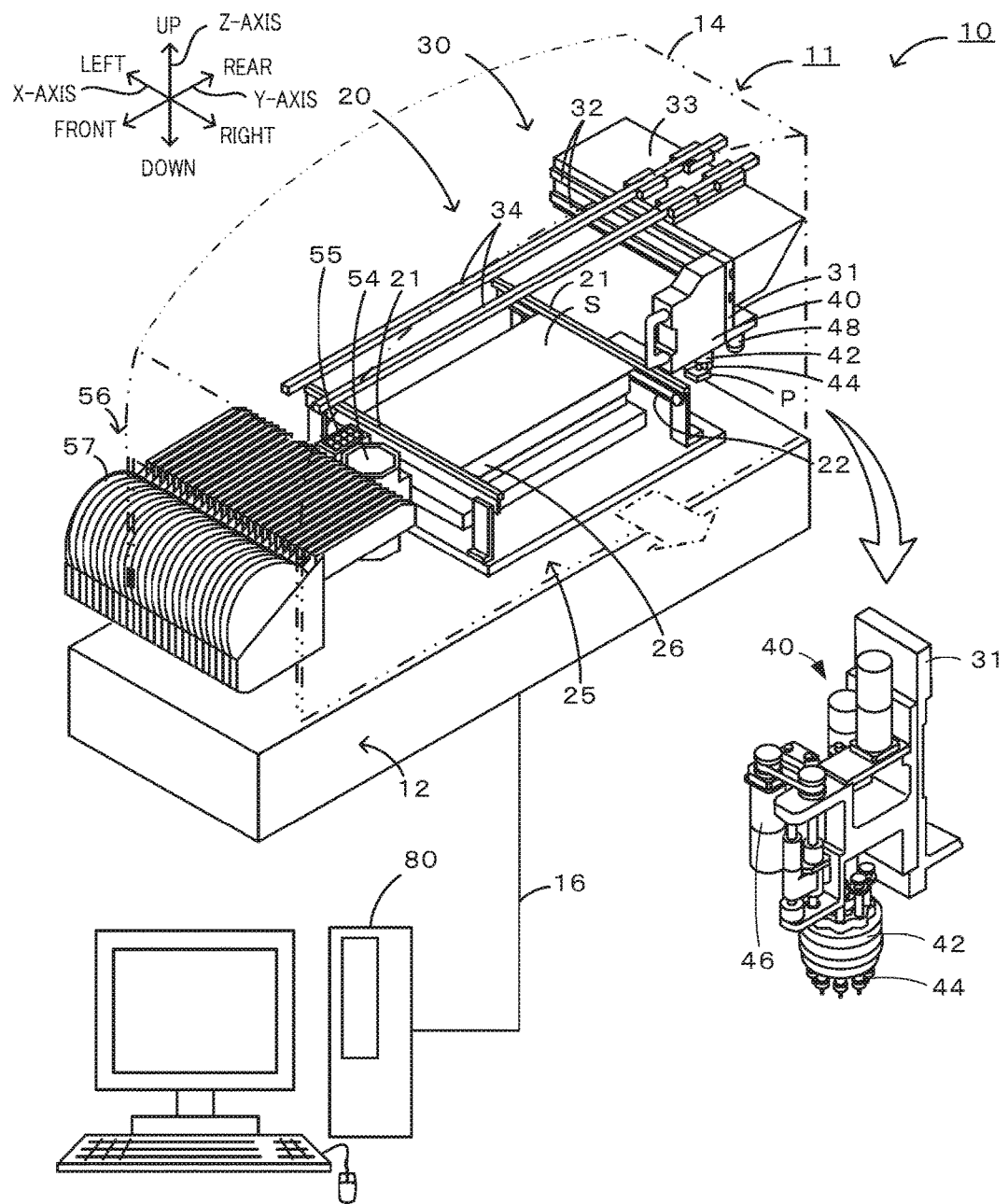
FIG. 1 is a schematic explanatory diagram of a component mounting system 10.
Figure 2:
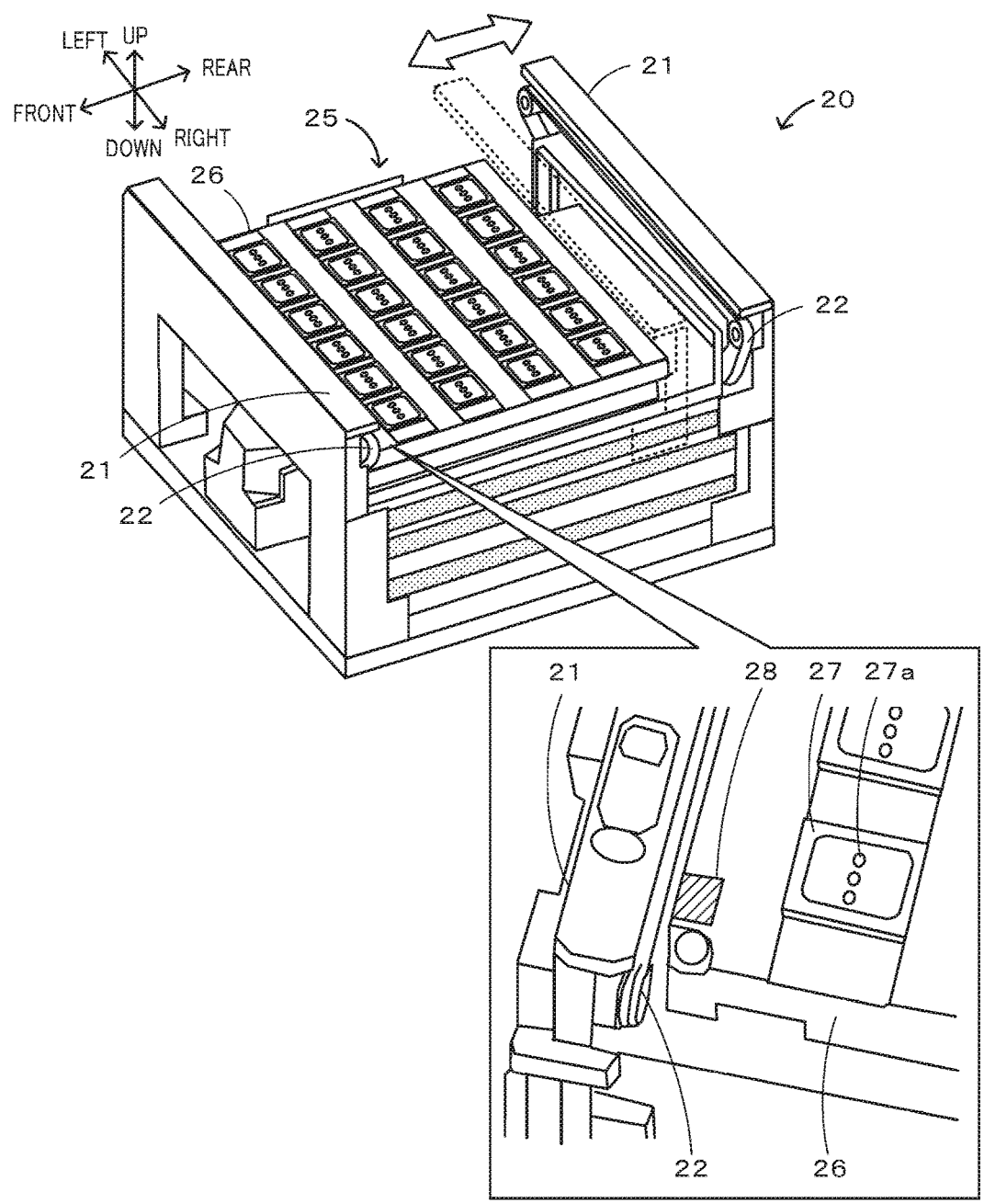
FIG. 2 is an explanatory diagram of a board conveyance unit 20 and a board support unit 25.
Figure 3:
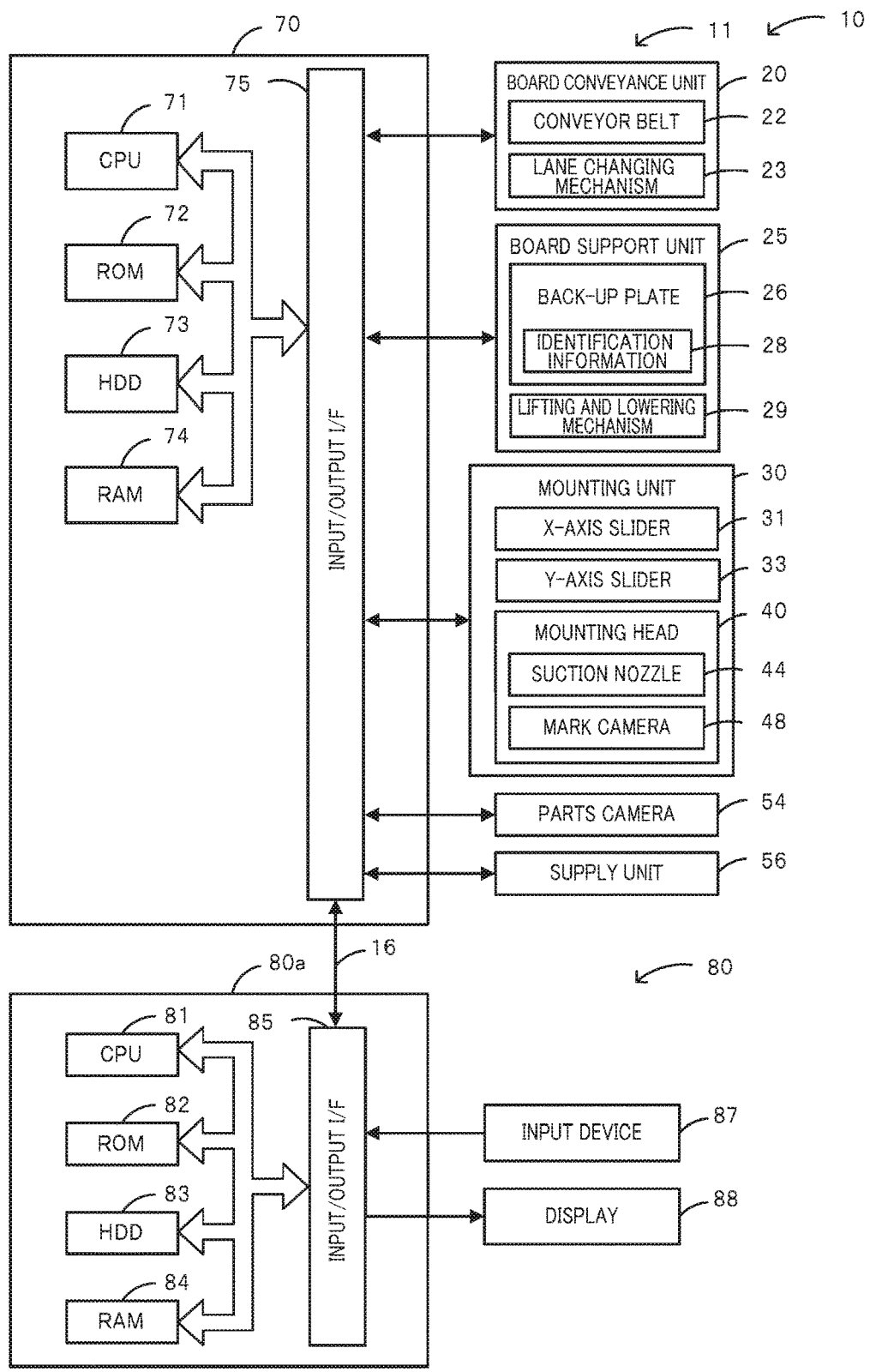
FIG. 3 is a block diagram depicting an electrical connection relationship of the component mounting system 10.

Hereinafter, a preferable embodiment of the present disclosure will be described with reference to the drawings. FIG. 1 is a schematic explanatory diagram of a component mounting system 10. FIG. 2 is an explanatory diagram of a board conveyance unit 20 and a board support unit 25. FIG. 3 is a block diagram depicting an electrical connection relationship of the component mounting system 10. In the present embodiment, a transverse direction (X-axis), a forward-rearward direction (Y-axis), and a vertical direction (Z-axis) are as illustrated in FIGS. 1 and 2. In addition, the mounting processing includes processing and the like of placing, mounting, inserting, bonding, and gluing a component on a printed circuit board.

The component mounting system 10 includes a mounting machine 11 which is connected to a LAN 16 and is configured to be a mounting line, and a management computer 80 which is connected to the LAN 16 and manages information of the component to be mounted. In the component mounting system 10, a plurality of the mounting machines 11 each of which executes the mounting processing of mounting an electronic component (hereinafter, referred to as "the component P") on a printed circuit board S are disposed from the upstream side to the downstream side. In FIG. 1, only one mounting machine 11 is illustrated. The mounting machine 11 includes a base 12 and a mounting machine main body 14 which is installed on the base 12. The base 12 is a heavy load which is formed to have a rectangular parallelepiped shape, and leveling bolts (not illustrated) are attached to predetermined positions on the rear surface thereof.

The mounting machine main body 14 is installed on the base 12 in a replaceable manner. The mounting machine main body 14 includes the board conveyance unit 20 which conveys the printed circuit board S, the board support unit 25 which supports the printed circuit board S from a bottom surface side, a mounting unit 30 which has a mounting head 40 sucking (holding) the component P and moving the component P onto the printed circuit board S, a supply unit 56 in which a reel 57 accommodating the component P is mounted, and a control device 70 which executes various types of control (refer to FIG. 4). In addition, the mounting machine main body 14 includes a parts camera 54 which images the component P which is sucked by a suction nozzle 44, and a nozzle stocker 55 stocking a plurality of types of the suction nozzles 44 which are attachable to the mounting head 40.

The board conveyance unit 20 includes supporting boards 21 and 21 which are provided at an interval to the front and the rear in FIG. 2 and extend in the transverse direction, and conveyor belts 22 and 22 (only one is illustrated in FIG. 1) which are respectively provided on surfaces of both the supporting boards 21 and 21 facing each other. The conveyor belts 22 and 22 are hung across a drive wheel and a driven wheel which are respectively provided on the right and left supporting boards 21 and 21 so as to be in an endless state. The printed circuit board S is set on the top surface of a pair of the conveyor belts 22 and 22 and is conveyed from left to right. The printed circuit board S is supported by a back-up plate 26 which is arranged on a rear surface side. In addition, the board conveyance unit 20 includes a lane changing mechanism 23 which moves the supporting board 21 and the conveyor belt 22 on one side to a plurality of conveyance widths in accordance with the width of the printed circuit board S and changes a conveyance lane (refer to FIG. 3). The lane changing mechanism 23 includes a guide rail (not illustrated) which guides the supporting board 21 and the conveyor belt 22 to the rear side of the device in the forward-rearward direction, and a motor which moves the supporting board 21 and the conveyor belt 22 along the guide rail.

The board support unit 25 is a unit supporting the printed circuit board S from the rear surface side of the printed circuit board S which is conveyed by the board conveyance unit 20 and is fixed. As illustrated in FIG. 2, the board support unit 25 includes the detachable back-up plate 26, a plurality of suctioning support portions 27 which are provided on the back-up plate 26 and apply negative pressure to the printed circuit board S so as to suck and fix the printed circuit board S, and a lifting and lowering mechanism 29 which moves the back-up plate 26 in the vertical direction (refer to FIG. 3). For example, the back-up plate 26 is used for the printed circuit board S which has a plurality of child printed circuit boards. The back-up plate 26 is a board support member which is arranged on the inner side of the conveyance lane and supports the printed circuit board S from below. Identification information 28 which can specify the individual back-up plate 26 is formed at a predetermined position of the outer surface of the back-up plate 26. The identification information 28 may be a bar code, a two-dimensional code, or the like which can recognize information by performing imaging. A plurality of suctioning holes 27a are formed in each suctioning support portion 27. A suctioning pump (not illustrated) is connected to the suctioning holes 27a. The printed circuit board S is fixed by causing spaces between the printed circuit board S and the suctioning support portions 27 to be under negative pressure. The suctioning support portions 27 are respectively provided at positions corresponding to the plurality of child printed circuit boards of the printed circuit board S. The lifting and lowering mechanism 29 includes an arm which supports the back-up plate 26, and a motor which moves the arm in the vertical direction. The board support unit 25 can cope with the fixing of the plurality of types of the printed circuit boards S by replacing the back-up plate 26.

The mounting head 40 is replaceable. As illustrated in FIG. 1, the mounting head 40 holds (sucks) the component P and moves the component P onto the printed circuit board S. The mounting head 40 is attached to the front surface of an X-axis slider 31. The X-axis slider 31 is attached to the front surface of a Y-axis slider 33 which is slidable in the forward-rearward direction, so as to be slidable in the transverse direction. The Y-axis slider 33 is slidably attached to a pair of right and left guide rails 34 and 34 which extend in the forward-rearward direction. The guide rails 34 and 34 are fixed to the inside of the mounting machine 11. A pair of upper and lower guide rails 32 and 32 which extend in the transverse direction are provided on the front surface of the Y-axis slider 33. The X-axis slider 31 is attached to the guide rails 32 and 32 so as to be slidable in the transverse direction. The mounting head 40 moves in the transverse direction as the X-axis slider 31 moves in the transverse direction and moves in the forward-rearward direction as the Y-axis slider 33 moves in the forward-rearward direction. Each of the sliders 31 and 33 is driven by a drive motor. In the mounting head 40, a nozzle holding body 42 is supported in an intermittently rotatable manner. Each of a plurality of the suction nozzles 44 which suck the component is detachably mounted on the circumference of the nozzle holding body 42. The suction nozzles 44 are lifted and lowered in a Z-axis direction (vertical direction) orthogonal to an X-axis direction and a Y-axis direction by a holder lifting and lowering device having a Z-axis motor 46 as a drive source. The suction nozzles 44 suck the component P by using negative pressure, are rotated (revolved) by a rotating device (not illustrated), and are able to adjust the angle of the component P.

A mark camera 48 which images a lower side is arranged on the bottom surface of the mounting head 40. The mark camera 48 images a mark which is formed in the printed circuit board S. The control device 70 corrects a position at which the component P is to be placed, based on a position of the imaged mark of the printed circuit board S. In addition, the mark camera 48 images the identification information 28 which is arranged in the back-up plate 26. The control device 70 acquires information such as the type and an individual number of the back-up plate 26 from the imaged identification information 28.

As illustrated in FIG. 3, the control device 70 is configured to be a microprocessor, that is, mainly a CPU 71. The control device 70 includes a ROM 72 storing a processing program, an HDD 73 storing various types of data, a RAM 74 being used as a working area, an input/output interface 75 for transceiving electrical signals with respect to an external apparatus, and the like, which are connected to each other via a bus. The control device 70 outputs control signals to the board conveyance unit 20, the board support unit 25, the mounting unit 30, and the supply unit 56. The control device 70 outputs imaging signals to the parts camera 54. In addition, signals from the board conveyance unit 20, the board support unit 25, the mounting unit 30, and the supply unit 56 are input to the control device 70. Image signals from the parts camera 54 are input to the control device 70. In addition, the control device 70 is connected to the supply unit 56, the parts camera 54, and the management computer 80 so as to be able to perform bidirectional communication. Each of the X-axis slider 31 and the Y-axis slider 33 is equipped with a position sensor (not illustrated), and positional information from the position sensors is input to the control device 70, which controls the drive motor of each of the sliders 31 and 33.

Figure 5:
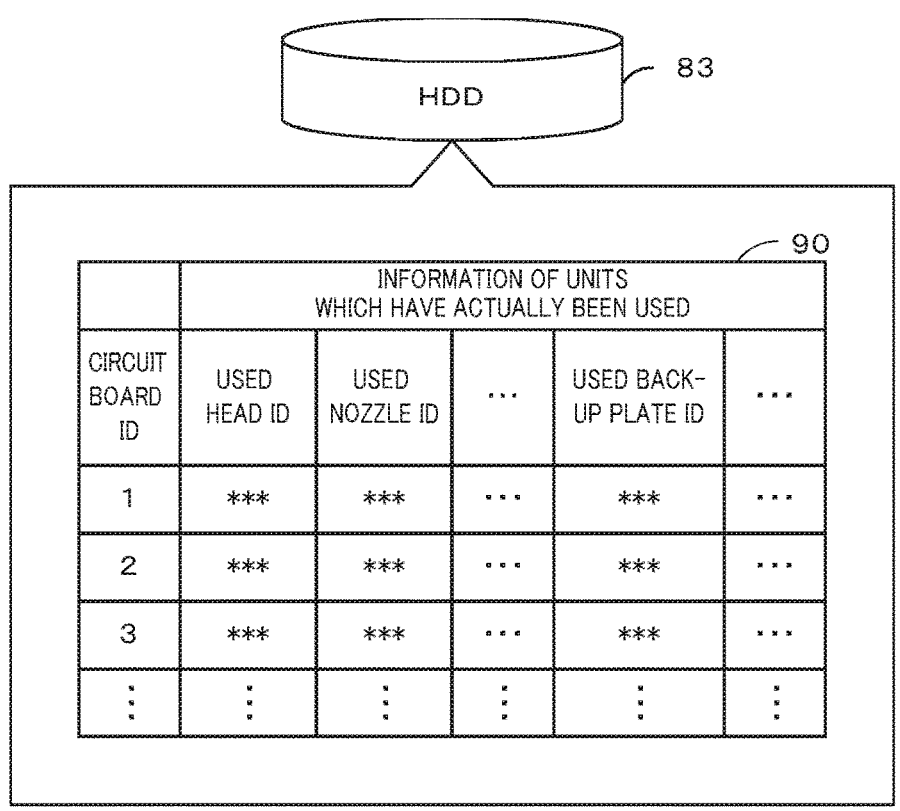
FIG. 5 is an explanatory diagram of production result information 90 which is stored in an HDD 83.

The management computer 80 is a computer which includes a control device 80a and manages information of the plurality of mounting machines 11. The control device 80a is configured to be a microprocessor, that is, mainly a CPU 81. The control device 80a includes a ROM 82 storing a processing program, an HDD 83 storing various types of data, a RAM 84 being used as a working area, an input/output interface 85 for transceiving electrical signals with respect to an external apparatus, and the like, which are connected to each other via a bus. In addition, the management computer 80 includes input devices 87 such as a keyboard, a mouse, and the like through which an operator inputs various types of commands, and a display 88 which displays various items of information. The HDD 83 of the management computer 80 stores mounting condition information which is used in mounting of the mounting machine 11, and production result information which includes information of the printed circuit board S having been produced. In the mounting condition information, for example, information such as the type and the placing position of the component P, the mounting head 40 and the suction nozzles 44 to be used, the type of the back-up plate 26 to be used, and the like is associated with the information of the printed circuit board S subjected to mounting. In the production result information, for example, information such as the mounting head 40 and the suction nozzles 44 which have been used, the type of the back-up plate 26 which has been used, and the like is associated with a printed circuit board ID of the printed circuit board S after being mounted (refer to FIG. 5 depicted later).

Figure 4:
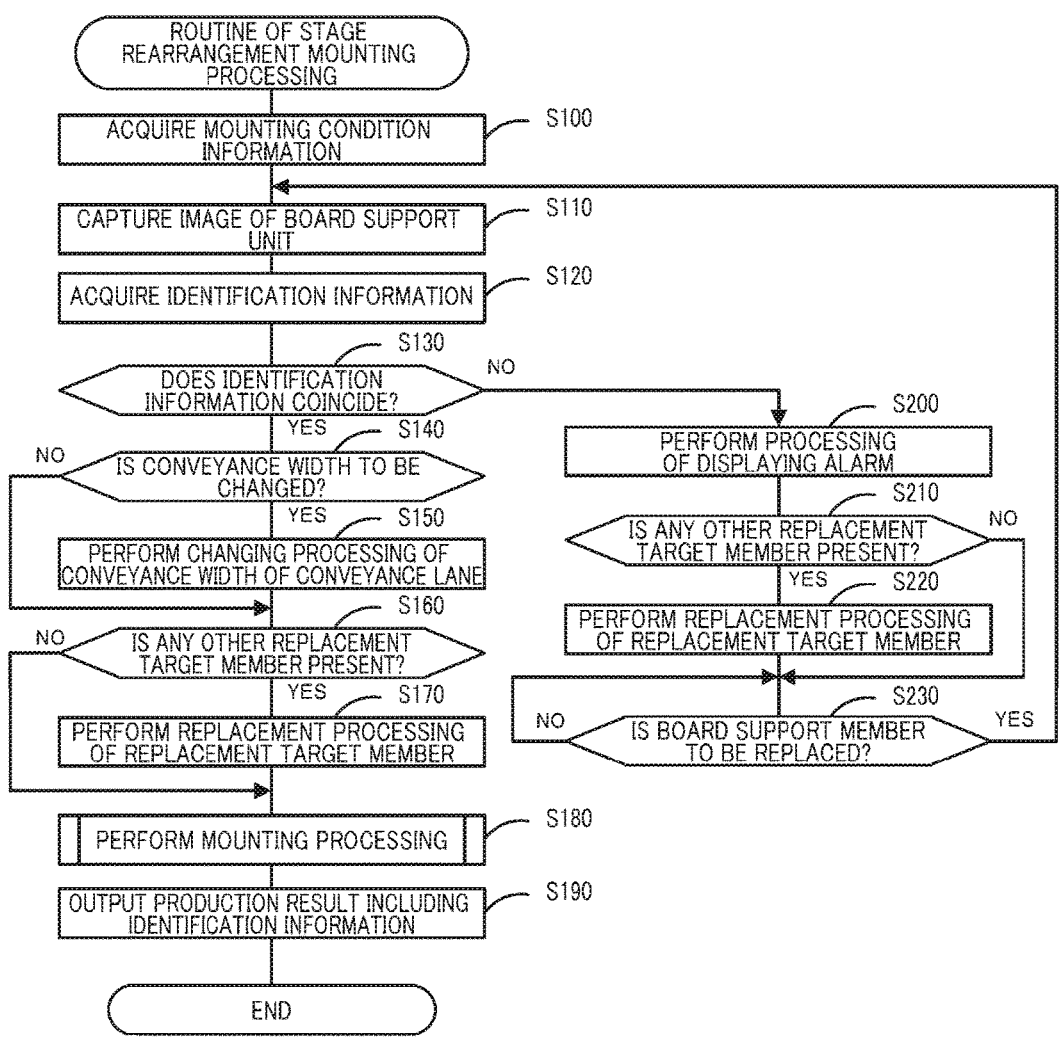
FIG. 4 is a flow chart illustrating an example of a routine of stage rearrangement mounting processing.

Subsequently, description will be given particularly regarding an operation of the mounting machine 11 of the present embodiment having such a configuration, for example, processing of replacing the back-up plate 26 and executing the mounting processing. FIG. 4 is a flow chart depicting a routine of stage rearrangement mounting processing executed by the CPU 71 of the control device 70. The routine is stored in the HDD 73 of the control device 70 and is executed in response to a start instruction of an operator. For example, the CPU 71 is configured to execute the routine by utilizing each of the units of the mounting machine 11. Here, description will be given on the assumption that the routine is executed after an operator replaces the back-up plate 26 and the like, when producing a preceding printed circuit board S has ended and producing a printed circuit board S different from the preceding printed circuit board S starts.

When the routine starts, the CPU 71 of the control device 70 first acquires the mounting condition information from the management computer 80 and stores the acquired mounting condition information in the HDD 73 (Step S100). Subsequently, the CPU 71 moves the mounting head 40 and captures images of the back-up plate 26 of the board support unit 25 by using the mark camera 48 (Step S110). In this case, the CPU 71 may lift the back-up plate 26 in a state of having no printed circuit board S so as to attain the depth of field of the mark camera 48. Subsequently, the CPU 71 discriminates an area of the identification information 28 among the captured images, thereby acquiring information such as the identification information, for example, the type and the individual number of the back-up plate 26 by analyzing the images of the acquired identification information 28 (Step S120).

Subsequently, the CPU 71 determines whether or not the identification information of the acquired back-up plate 26 coincides with the information of the back-up plate 26 included in the mounting condition information (Step S130). When the identification information coincides with the information thereof, the CPU 71 determines that a correct back-up plate 26 is arranged in the board support unit 25, thereby determining whether or not the conveyance width of the board conveyance unit 20 is to be changed (Step S140). This determination is performed based on whether or not the current conveyance width of the board conveyance unit 20 is different from the conveyance width included in the mounting condition information. When the conveyance width of the board conveyance unit 20 is changed, the CPU 71 outputs control signals to the lane changing mechanism 23 so as to change the conveyance width, thereby performing changing processing of the conveyance width of the conveyance lane (Step S150). In this manner, the CPU 71 controls the board conveyance unit 20 so as to change the conveyance lane based on the mounting condition information when the acquired identification information is the identification information which is included in the mounting condition information of the printed circuit board S.

After Step S150, or after it is determined not to change the conveyance width in Step S140, the CPU 71 determines whether or not any other replacement target member required to be replaced is present (Step S160). This determination is performed based on whether or not the device configuration of the current mounting machine 11 is different from the device configuration which is included in the next mounting condition information. For example, when the suction nozzle 44 is the replacement target member, determination is performed based on whether or not the current suction nozzle 44 mounted in the mounting head 40 is different from the suction nozzle which is included in the mounting condition information. The replacement target member is considered to have a device configuration in which replacement can be automatically performed under control of the control device 70 and replacement processing can be performed other than replacement of the back-up plate 26. As the replacement target member, for example, it is possible to exemplify the mounting head 40, the nozzle holding body 42 mounted in the mounting head 40, the suction nozzles 44 mounted in the mounting head 40, the nozzle stocker 55 stocking the suction nozzles 44, and the supply unit 56 supplying the component P. When a replacement target member is present, the CPU 71 executes the replacement processing of the replacement target member based on the information included in the mounting condition information (Step S170). In this case, the CPU 71 is considered to replace any one or more of the mounting head 40, the nozzle holding body 42, the suction nozzle 44, the supply unit 56, and the like, as necessary.

After Step S170, or after it is determined that no replacement target member is present in Step S160, the CPU 71 executes the mounting processing (Step S180). In the mounting processing, based on the mounting condition information, the CPU 71 performs processing in which the mounting head 40 is moved to an ejecting position of the supply unit 56 containing the component P, the suction nozzles 44 are lowered, and the suction nozzles 44 suck the component P. Successively, the CPU 71 performs processing in which the mounting head 40 is moved to a predetermined position, the suction nozzles 44 are lowered, and the component P is placed on the printed circuit board S. The CPU 71 performs the suctioning processing and the placing processing with respect to all of the components and all of the printed circuit boards S. As the mounting processing is executed, the CPU 71 outputs information regarding a production result which includes the identification information of the back-up plate 26 to the management computer 80 (Step S190), thereby ending the routine. FIG. 5 is an explanatory diagram of production result information 90 which is stored in the HDD 83 of the management computer 80. In the production result information 90, in addition to the information such as the mounting head 40 and the suction nozzles 44 which have been used, the type of the back-up plate 26 which has been used, and the like, the information and the like regarding the mounted component is associated with the printed circuit board ID of the printed circuit board S which has been mounted. A manufacturer of the printed circuit board S can check which printed circuit board is manufactured by which unit afterwards through the production result information 90.

Meanwhile, when the identification information does not coincide with the information thereof in Step S130, the CPU 71 causes an operation panel (not illustrated) to display an alarm display (Step S200). In other words, the CPU 71 stops changing the conveyance lane, that is, there is no change of the conveyance lane when the acquired identification information is not the identification information which is included in the mounting conditions of the printed circuit board S. In this case, the CPU 71 may issue an alarm sound. Subsequently, similar to Steps S160 and S170, the CPU 71 determines whether or not a replacement target member is present (Step S210). When a replacement target member is present, the replacement processing of the replacement target member is executed (Step S220). In other words, the CPU 71 executes the changing processing regarding the mounting processing (here, replacement of the mounting head 40, the nozzle holding body 42, the suction nozzles 44, and the supply unit 56) based on the mounting condition information while the conveyance lane is stopped from being changed. In this manner, while an operator performs replacement work of the back-up plate 26, the CPU 71 performs changing work so as to be able to execute processing by using the mounting machine 11.

After Step S220, or after it is determined not to change the suction nozzles 44 in Step S210, the CPU 71 determines whether or not the back-up plate 26 (the board support member) is replaced based on an operation of the operation panel (not illustrated) (Step S230). A sensor may be provided at a fixed position of the back-up plate 26 so as to determine whether or not the back-up plate 26 is replaced, through a signal of the sensor. When the back-up plate 26 is not replaced, the CPU 71 stands by with no further action. When the back-up plate 26 is replaced, the CPU 71 executes processing after Step S110. In other words, the CPU 71 captures images of the board support unit 25 and acquires the identification information 28 of the back-up plate 26, thereby checking the acquired identification information 28 and the identification information which is included in the mounting condition information by comparing both thereof. When the identification information coincides with the information thereof in Step S130, the CPU 71 changes the conveyance width of the conveyance lane as necessary. In this case, since the replacement target member has already been replaced in Step S220, the CPU 71 executes the mounting processing while omitting the replacement processing of the replacement target member in Step S170 and outputs the production result information, thereby ending the routine. In this manner, the CPU 71 further shortens the processing time by executing the replacement processing of other replacement target members first when a wrong back-up plate 26 is mounted in the board support unit 25.

Here, a correspondence relationship between the configuration elements of the present embodiment and the configuration elements of the present disclosure will be clearly described. The lane changing mechanism 23 of the present embodiment corresponds to the changing mechanism, the back-up plate 26 corresponds to the board support member, the mark camera 48 corresponds to information acquisition device, and the control device 70 corresponds to control device.

According to the mounting machine 11 described above, the identification information arranged in the back-up plate 26 is acquired from the back-up plate 26, and when the acquired identification information is the identification information which is included in the mounting conditions of the printed circuit board, the conveyance unit is controlled based on the mounting conditions so as to change the conveyance lane. Meanwhile, in the mounting machine 11, when the acquired identification information is not the identification information which is included in the mounting conditions of the printed circuit board, the conveyance lane is stopped from being changed. For example, in a case where a back-up plate greater than the back-up plate regulated by the mounting conditions is erroneously mounted in the board support unit, if the control device 70 changes the conveyance lane in accordance with the mounting conditions, the back-up plate may come into contact with the board conveyance unit 20 (for example, the conveyor belt 22). Here, since the conveyance width of the conveyance lane is not changed when the back-up plate 26 which is ready to be subjected to the mounting processing and matches the mounting conditions is not mounted, the control device 70 can prevent the back-up plate 26 and the board conveyance unit 20 (for example, the conveyor belt 22) from interfering with each other. Therefore, the mounting machine 11 can more reliably change the conveyance width of the board conveyance unit 20 when performing the replacement processing of the back-up plate 26.

In addition, since the mounting machine 11 executes the changing processing regarding the mounting processing, for example, changing of the replacement target member such as the mounting head 40, the nozzle holding body 42, the suction nozzles 44, and the supply unit 56 based on the mounting condition information while the conveyance lane is stopped from being changed, the conveyance width of the board conveyance unit 20 can be more reliably changed, and the changing processing accompanying replacement of the back-up plate 26 can be more efficiently performed. Moreover, since the mounting machine 11 causes the mounting unit 30 to execute the mounting processing after the conveyance lane is changed, and outputs the information of the printed circuit board which has been subjected to the mounting processing and the identification information of the back-up plate 26 to the HDD 83 of the management computer 80, it is possible to utilize the information (the production result information 90) of the correspondence relationship between the printed circuit board and the back-up plate 26 thereafter. Furthermore, since the identification information 28 which is recognizable by being imaged is arranged in the back-up plate 26, the mounting machine 11 can acquire the identification information through the imaging processing. In addition, the mark camera 48 imaging the printed circuit board S can also be used to image the printed circuit board and the identification information. Therefore, it is possible to simplify the configuration and to more reliably change the conveyance width of the board conveyance unit 20.

The present disclosure is not limited to the above-described embodiment by any reason, and it is needless to mention that the present disclosure can be executed in various aspects as long as the aspects are included in the technical scope of the present disclosure.

For example, in the above-described embodiment, the changing processing of the replacement target member (for example, the mounting head 40, the nozzle holding body 42, the suction nozzle 44, the nozzle stocker 55, and the supply unit 56) is performed based on the mounting conditions while the conveyance lane is stopped from being changed. However, as long as the changing processing regarding the mounting processing is executed, processing is not particularly limited thereto. For example, the replacement processing of the member other than the above-referenced replacement target members may be performed in place thereof or in addition thereto. Moreover, one or more of the mounting head 40, the nozzle holding body 42, the suction nozzles 44, and the supply unit 56 may be excluded from the replacement target member. Otherwise, the mounting machine 11 may omit the execution of the changing processing while the conveyance lane is stopped from being changed. Nevertheless, the conveyance width of the board conveyance unit 20 can be more reliably changed.

In the above-described embodiment, the mounting machine 11 outputs the information of the printed circuit board in which mounting has been executed and the identification information of the back-up plate 26 to the management computer 80. However, without being limited thereto, the production result information 90 may be stored in the HDD 73 or may be output to a different PC. Otherwise, in the mounting machine 11, processing of outputting the information of the printed circuit board in which mounting has been executed and the identification information of the back-up plate 26 may be omitted. Nevertheless, the conveyance width of the board conveyance unit 20 can be more reliably changed.

In the above-described embodiment, the board support unit 25 is imaged and the identification information of the back-up plate 26 is acquired. However, without being limited thereto, the identification information of the back-up plate 26 may be stored in a contact-type or non-contact-type memory element (for example, RFID) or the like, thereby being ready to start acquiring the identification information. Nevertheless, the conveyance width of the board conveyance unit 20 can be more reliably changed. As described in the above-described embodiment, since the configuration related to reading processing can be omitted, it is preferable to utilize the mark camera 48.

In the above-described embodiment, the mounting head 40 sucks the component P. However, as long as the mounting head 40 holds the component P, the method of sucking thereof is not limited. For example, the mounting head 40 may hold the component P by causing a grasp unit to hook the component P.

In the above-described embodiment, description is given regarding the mounting machine 11 which includes the function of the present disclosure. However, without being particularly limited thereto, the present disclosure may be realized in a form of a mounting processing method or a program thereof.

INDUSTRIAL APPLICABILITY

The present disclosure can be utilized in a technical field of mounting processing in which a component is mounted on a printed circuit board.

REFERENCE SIGNS LIST

10: component mounting system, 11: mounting machine, 12: base, 14: mounting machine main body, 16: LAN, 20: board conveyance unit, 21: supporting board, 22: conveyor belt, 23: lane changing mechanism, 25: board support unit, 26: back-up plate, 27: suctioning support portion, 27a: suction hole, 28: identification information, 29: lifting and lowering mechanism, 30: mounting unit, 31: X-axis slider, 32: guide rail, 33: Y-axis slider, 34: guide rail, 40: mounting head, 42: nozzle holding body, 44: suction nozzle, 46: Z-axis motor, 48: mark camera, 54: parts camera, 55: nozzle stocker, 56: supply unit, 57: reel, 70: control device, 71: CPU, 72: ROM, 73: HDD, 74: RAM, 75: input/output interface, 80: management computer, 80a: control device, 81: CPU, 82: ROM, 83: HDD, 84: RAM, 85: input/output interface, 87: input device, 88: display, 90: production result information, P: component, and S: printed circuit board

The invention claimed is:

1. A mounting machine which executes a mounting processing of mounting a component on a printed circuit board, the mounting machine comprising:
   a mounting unit that has a mounting head for holding the component and moving the component onto the printed circuit board,
   a conveyance unit that has a changing mechanism for changing a conveyance lane to a plurality of conveyance widths in accordance with a width of the printed circuit board and conveying the printed circuit board,
   a detachable board support member which is arranged on an inner side of the conveyance lane and supports the printed circuit board from below, the detachable board support member including identification information,
   an information acquisition device which acquires the identification information arranged in the detachable board support member; and
   a control device that comprises a memory device that stores mounting conditions for the printed circuit board including which detachable board support members can be used to support the printed circuit board during the mounting processing, wherein the control device controls the conveyance unit so as to change the conveyance lane to a conveyance width corresponding to the printed circuit board based on mounting conditions of the printed circuit board when the identification information acquired from the detachable board support member is identification information which is included in the mounting conditions of the printed circuit board and stopping the conveyance lane from being changed to a different conveyance width when the identification information acquired from the detachable board support member is not identification information which is included in the mounting conditions of the printed circuit board.

2. The mounting machine according to claim 1, wherein the control device executes a changing processing related to the mounting processing based on the mounting conditions while the conveyance lane is stopped from being changed.

3. The mounting machine according to claim 2,
   wherein the changing processing is processing of one or more among replacement of the mounting head, replacement of a nozzle holding body which is mounted in the mounting head, replacement of a suction nozzle which is mounted in the mounting head, replacement of a nozzle stocker, and replacement of a supply unit which supplies the component.

4. The mounting machine according to claim 1, wherein the control device causes the mounting unit to execute the mounting processing after changing the conveyance lane to a conveyance width corresponding to the printed circuit board and outputs information of the printed circuit board subjected to the mounting processing and the acquired identification information of the board support member to the memory device.

5. The mounting machine according to claim 1,
   wherein the identification information which is recognizable by being imaged is arranged in the board support member, and
   wherein the information acquisition device acquires the identification information by imaging the identification information of the board support member.

6. The mounting machine according to claim 1,
   wherein the board support member is a vacuum back-up unit which fixes one or more printed circuit boards.

\* \* \* \* \*